United States Patent
Gopalakrishna et al.

(10) Patent No.: US 10,485,136 B2
(45) Date of Patent: Nov. 19, 2019

(54) LOW PROFILE FAN ASSEMBLIES

(71) Applicant: Seagate Technology LLC, Cupertino, CA (US)

(72) Inventors: Shankar Gopalakrishna, Bangalore (IN); Kiran Devapalan, Bangalore (IN); Saju Cheeran Verghese Francis, Bangalore (IN); Vivekananda Avvaru, Bangalore (IN); Anil KC, Bangalore (IN)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/835,147

(22) Filed: Dec. 7, 2017

(65) Prior Publication Data

US 2019/0182982 A1 Jun. 13, 2019

(51) Int. Cl.
| | | |
|---|---|---|
| *H05K 7/20* | (2006.01) | |
| *G06F 1/20* | (2006.01) | |
| *G06F 1/18* | (2006.01) | |
| *H05K 7/14* | (2006.01) | |

(52) U.S. Cl.
CPC ......... *H05K 7/20172* (2013.01); *G06F 1/181* (2013.01); *G06F 1/20* (2013.01); *H05K 7/1402* (2013.01); *H05K 7/20727* (2013.01); *H05K 7/1422* (2013.01); *H05K 7/20581* (2013.01)

(58) Field of Classification Search
CPC ........... H05K 7/20172; H05K 7/20727; H05K 7/1402; H05K 7/1422; H05K 7/20736; H05K 7/20718; H05K 7/20136; H05K 7/20581; G06F 1/181; G06F 1/20; G06F 1/206; F25D 25/025; F25D 17/06

USPC .... 361/679.51, 695, 679.48, 679.33, 679.46, 361/679.02, 679.37, 724, 725, 727; 312/404, 236; 454/184; 360/97.13, 360/98.01

See application file for complete search history.

(56) References Cited

U.S. PATENT DOCUMENTS

| | | | |
|---|---|---|---|
| 5,788,566 A | 8/1998 | McAnnally et al. | |
| 6,375,440 B2 | 4/2002 | Kosugi | |
| 6,592,327 B2 | 7/2003 | Chen et al. | |
| 7,251,135 B2 | 7/2007 | Crippen et al. | |
| 7,408,772 B2 | 8/2008 | Grady et al. | |
| 7,599,175 B1 | 10/2009 | Ong et al. | |
| 7,628,503 B1 * | 12/2009 | Pumm ................ | E05B 17/103 362/109 |
| 7,746,652 B2 * | 6/2010 | Horng ................ | H01L 23/4093 165/80.3 |
| 8,031,467 B2 | 10/2011 | Cheng et al. | |
| 8,300,404 B2 | 10/2012 | Tan | |
| 9,565,785 B2 * | 2/2017 | Tsai ................ | H05K 7/20172 |
| 9,615,480 B2 | 4/2017 | Pronozuk et al. | |
| 9,699,941 B2 | 7/2017 | Alvarado et al. | |
| 2005/0238494 A1 | 10/2005 | Lien et al. | |
| 2007/0053159 A1 * | 3/2007 | Crippen ............ | H05K 7/20172 361/695 |
| 2008/0107479 A1 * | 5/2008 | Yang ................ | H05K 7/20172 403/155 |

(Continued)

*Primary Examiner* — Mandeep S Buttar
(74) *Attorney, Agent, or Firm* — Faegre Baker Daniels LLP

(57) ABSTRACT

A fan assembly includes a fan module having a plurality of mounting openings, a housing partially surrounding the fan module, and a plurality of dampers that extend through the plurality of mounting openings to couple the fan module to the housing.

13 Claims, 8 Drawing Sheets

(56) References Cited

U.S. PATENT DOCUMENTS

| | | |
|---|---|---|
| 2009/0016878 A1 | 1/2009 | Huang et al. |
| 2010/0108847 A1 | 5/2010 | Li |
| 2010/0142143 A1 | 6/2010 | Ong et al. |
| 2010/0232976 A1* | 9/2010 | Li .................... G06F 1/20 416/244 R |
| 2011/0076932 A1 | 3/2011 | Li |
| 2012/0085883 A1 | 4/2012 | Lu |
| 2012/0140383 A1 | 6/2012 | Chiang |
| 2012/0163970 A1 | 6/2012 | Shu et al. |
| 2013/0064650 A1* | 3/2013 | Wang .................... G06F 1/20 415/182.1 |
| 2013/0265725 A1* | 10/2013 | Harvilchuck .......... G06F 1/181 361/720 |
| 2014/0241875 A1* | 8/2014 | Tsai .................. H05K 7/20172 415/213.1 |
| 2015/0056034 A1* | 2/2015 | Anson .................. B23B 49/026 408/115 B |
| 2016/0037685 A1 | 2/2016 | Ross |
| 2017/0114803 A1 | 4/2017 | Miwa |

\* cited by examiner

LOW PROFILE FAN ASSEMBLIES

SUMMARY

In certain embodiments, a data storage system includes a drawer and a fan assembly positioned within the drawer. The fan assembly includes a fan module having a plurality of mounting openings, a housing partially surrounding the fan module, and a plurality of dampers that extend through the plurality of mounting openings to couple the fan module to the housing.

In certain embodiments, a fan assembly includes a fan module and a housing partially surrounding the fan module. The housing includes a first housing member having a first finger guard, a first handle, a first coupler, a second handle, and a second coupler. The housing further includes a second housing member having a second finger guard, the second housing member being coupled to the first housing member.

In certain embodiments, an apparatus includes a fan module having a plurality of mounting openings, a housing partially surrounding the fan module, and a plurality of dampers that extend through the plurality of mounting openings to couple the fan module to the housing.

In certain embodiments, a method for removing a fan assembly from a fan cage includes pulling a first tab portion of the fan assembly and a second tab portion of the fan assembly toward each other. The method further includes decoupling at least one coupler of the first pull portion and of the second pull tab portion from respective openings of the fan cage and removing the fan assembly from the fan cage.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

Figure 1:
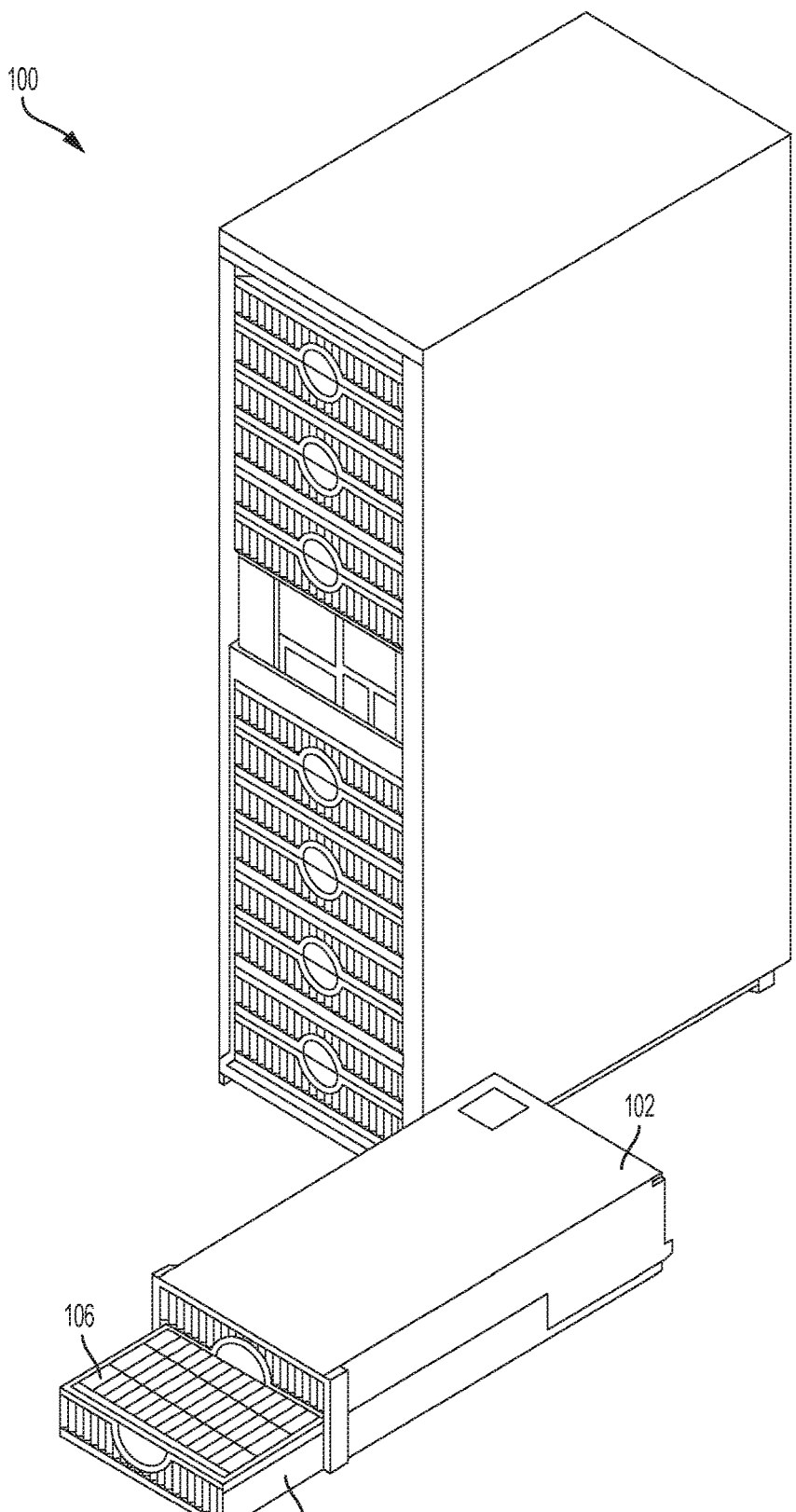
FIG. 1 shows a perspective view of a storage system, in accordance with certain embodiments of the present disclosure.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope the appended claims.

DETAILED DESCRIPTION

Data storage systems are used to store and process vast amounts of data. These systems are space constrained, and it can be challenging to keep the systems below a desired temperature because of the amount of heat the systems typically generate during operation. Further, to avoid overheating, it may be important to be able to quickly replace failed parts, such as cooling devices (e.g., fans), because data storage systems usually operate non-stop. Certain embodiments of the present disclosure feature low-profile fan assemblies that can be incorporated into data storage systems, are simple to replace, and have a small footprint.

FIG. 1 shows a data storage system 100 including a rack 102 (e.g., a cabinet) with a plurality of drawers 104. Each drawer 104 can be configured as a sliding enclosure such that the drawer 104 can extend horizontally away from the rack 102 to expose a set of data storage devices 106 installed within the drawer 104.

Figure 2:
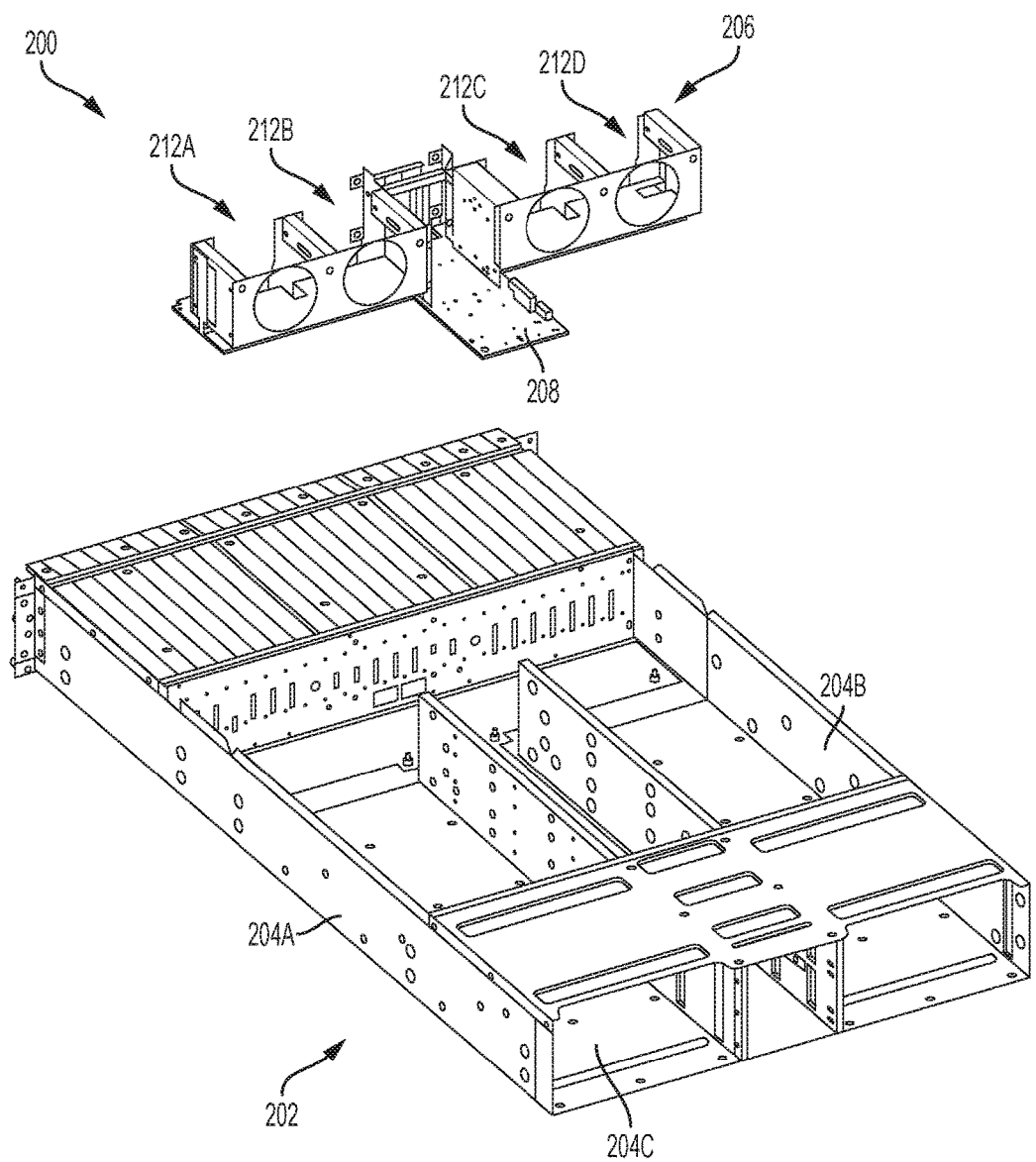
FIG. 2 shows an exploded, perspective view of a drawer, in accordance with certain embodiments of the present disclosure.
Figure 3:
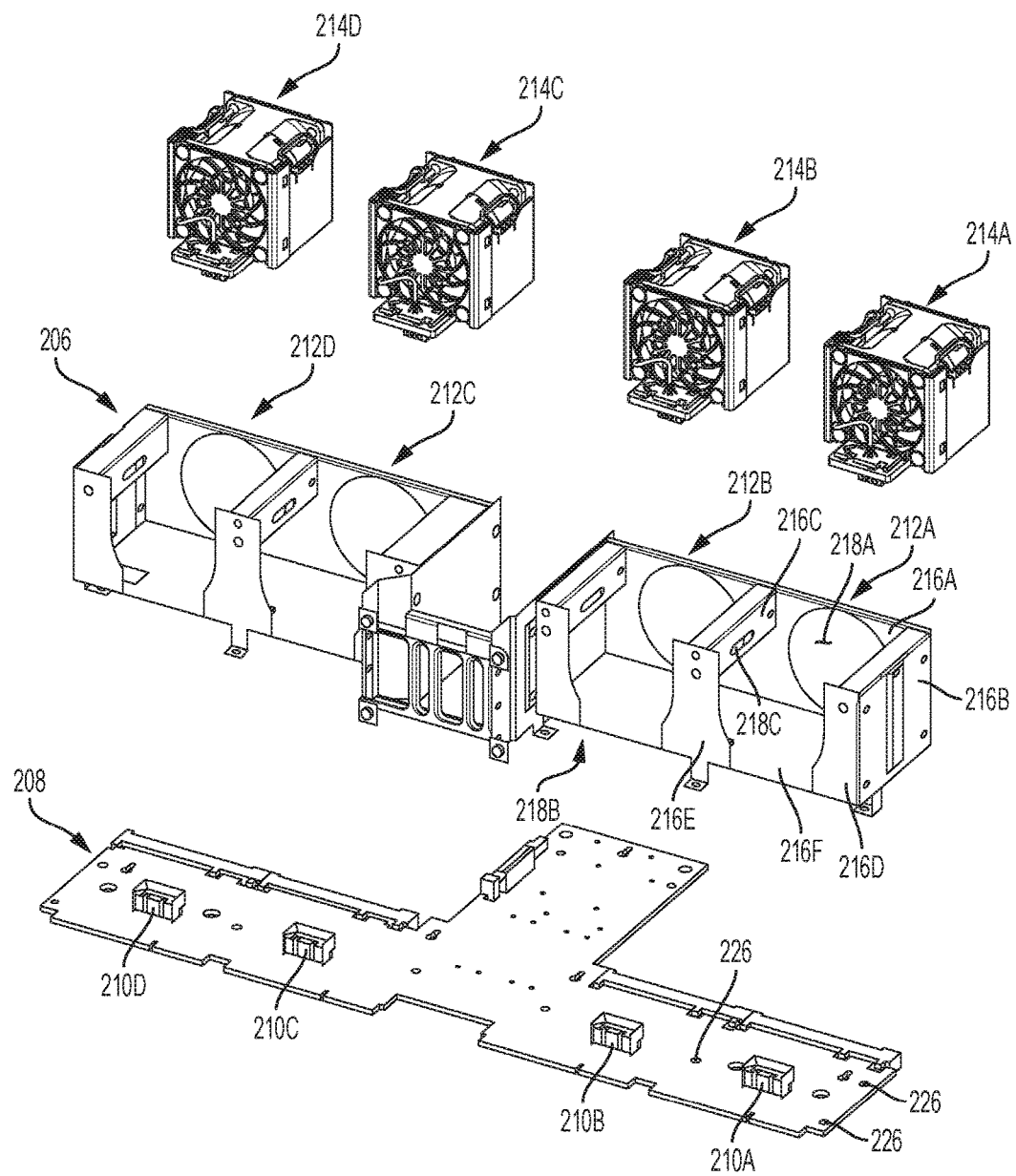
FIG. 3 shows an exploded, perspective view of a fan cage assembly, in accordance with certain embodiments of the present disclosure.

FIG. 2 shows an exploded view of a drawer 200, such as the drawer 104 in FIG. 1, which can be utilized in a data storage system such as the data storage system 100 of FIG. 1. The drawer 200 includes a chassis 202 with a first side wall 204A, a second side wall 204B, a bottom wall 204C, and a top cover (not shown). The chassis 202 forms an interior space for housing storage components (e.g., hard disc drives and solid state drives), electrical components (e.g., wiring and circuit boards, and cooling devices (e.g., fan modules). The drawer 200 includes a fan cage assembly 206 and a printed circuit board assembly 208 that is coupled to the fan cage assembly 206. As shown in FIG. 3, the printed circuit board assembly 208 includes individual electrical connectors 210A-210D for electrically connecting the printed circuit board assembly 208 to respective fan modules (discussed in more detail below) to power the fan modules.

As shown in FIGS. 2-3, the fan cage assembly 206 also includes individual fan cages 212A-212D, which are shaped to receive fan assemblies 214A-214D. Although FIGS. 2-3 show the fan cage assembly 206 including four fan cages 212A-212D, the fan cage assembly 206 can include fewer or more fan cages depending on the available space and cooling requirements. Each fan cage 212A-212D may include a first sidewall 216A, a second sidewall 216B, a third sidewall 216C, a fourth sidewall 216D, a fifth sidewall 216E, and a bottom wall 216F. The first sidewall 216A forms a first opening 218A to allow air flow to or from the fan modules, and the fourth sidewall 216D and the fifth sidewall 216E form a second opening 218B on an opposite side of the fan modules to allow air flow to or from the fan modules. In certain embodiments, the fourth sidewall 216D and the fifth sidewall 216E constitute a single sidewall that forms the second opening 218B. The third sidewall 216C forms a third opening 218C, and the second sidewall 216B forms a fourth opening 218D. As will be described in more detail below, the third opening 218C and the fourth opening 218D are shaped to receive couplers from the fan assemblies 214A-214D such that the fan assemblies 214A-214D can be removably coupled to respective fan cages 212A-212D. The fan cages 212A-212D may share sidewalls and bottom walls with one or more of the other fan cages 212A-212D.

Figure 4A:
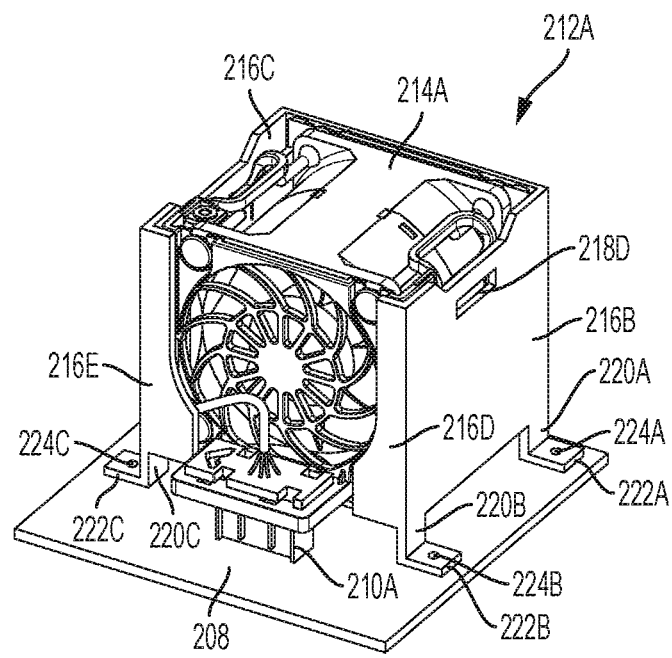
FIG. 4A shows a partial, perspective view of a fan cage assembly, in accordance with certain embodiments of the present disclosure.
Figure 4B:
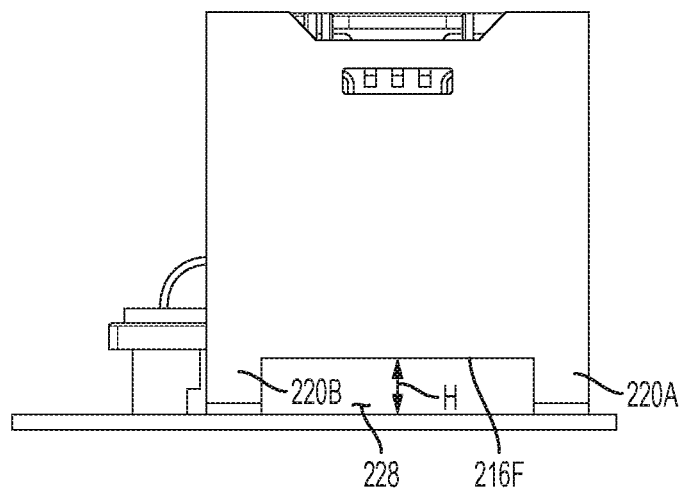
FIG. 4B shows a partial, side view of the fan cage assembly of FIG. 4A.

FIGS. 4A-4B show a fan cage similar to the fan cage 212A shown in FIG. 3. Similar reference numbers are used for the fan cages shown in FIGS. 3 and 4A-4B. The fan cage 212A in FIGS. 4A-4B includes one or more legs 220 (e.g., a first leg 220A, a second leg 220B, a third leg 220C, and a fourth leg (not shown)) extending from the bottom wall 216F of the fan cage assembly 206 to the printed circuit board assembly 208. Each of the legs 220 can include feet (e.g., a first foot 222A, a second foot 222B, a third foot 222C, and a fourth foot (not shown)) that each include mounting holes (e.g., a first mounting hole 224A, a second mounting hole 224B, a third mounting hole 224C, and a fourth mounting hole (not shown)). The mounting holes 224 of the feet 222 can align with mounting holes 226 of the printed circuit board assembly 208, such that a fastener (e.g., screw) can extend through the respective mounting holes to couple the feet 222 (and therefore the fan cage assembly 206) to the printed circuit board assembly 208.

As shown in FIG. 4B, when the fan cage 212A is coupled to the printed circuit board assembly 208, there is a space 228 having a height H between a bottom wall 216F of the fan cage 212A and the printed circuit board assembly 208. The space 228 provides a path for electrical components (e.g., cables and bus bars) underneath the fan cage assembly 206 to increase design flexibility for routing various electrical components. As will be shown below, this space 228 is created and able to be utilized, in part, because of the low-profile design of the fan assemblies 214A-214D. This low-profile design also allows for the printed circuit board assembly 208 to be installed underneath the fan cage assembly 206. In addition, although the fan cage 212A is described above as having four legs and feet, each fan cage 212A-D (and therefore the fan cage assembly 206) can include fewer than four legs and feet, e.g., as shown in FIG. 3, to reduce the footprint of the fan cage assembly 206 and provide additional flexibility and room for routing electrical components within the drawer 102.

Figure 5:
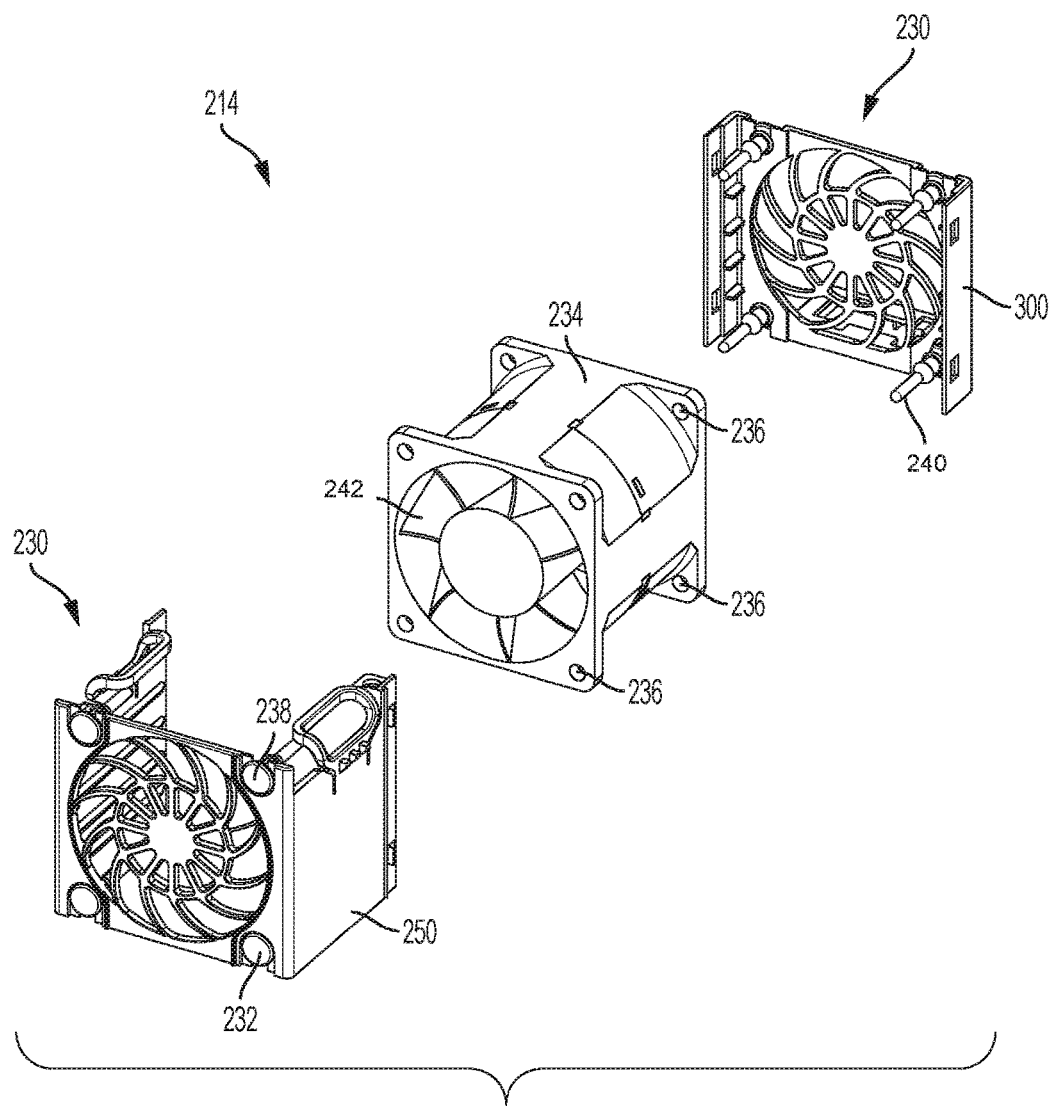
FIG. 5 shows an exploded, perspective view of a fan assembly, in accordance with certain embodiments of the present disclosure.

FIG. 5 shows an exploded view of one of the fan assemblies 214A-214D, which are each configured to be removably coupled to respective fan cages 214A-214D. The fan assembly 214 in FIG. 5 includes a housing 230, a plurality of dampers 232, and a fan module 234. In certain embodiments, the plurality of dampers 232 couple, at least in part, the fan module 234 to the housing 230. For example, the fan module 234 is shown as having a plurality of mounting holes 236 through which a portion of the plurality of dampers 232 can extend through. The plurality of dampers 232 can each include a head portion 238 and an extension portion 240. The extension portion 240 can extend through one of the plurality of mounting holes 236, while the head portion 238 can fit into a recessed portion of the housing 230. In certain embodiments, the dampers 232 comprise a viscoelastic material (e.g., an elastomer such as a vinyl-based elastomer). In certain embodiments, the entire structure of the dampers 232 comprises an elastomer. In certain embodiments, only one of the head portion 232 and the extension portion 240 comprises an elastomer. The dampers 232 assist with dampening vibration generated by the fan module 234 and mitigate transfer of the generated vibration from the fan module 234 to other parts of the drawer 200 and the data storage system 100. In addition, the dampers 232 fasten the fan module 234 to the housing 230. The fan module 234 can be a single- or multi-rotor fan module and include a plurality of fan blades 242 that rotate to move air, which helps cool the drawer 200.

Figure 6A:
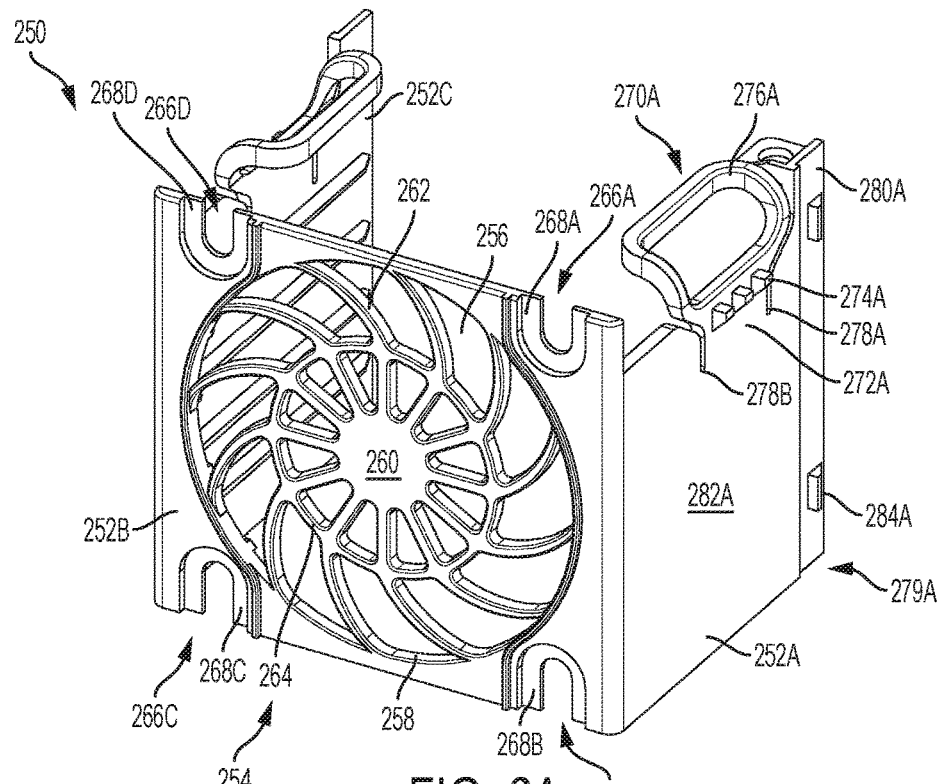
FIGS. 6A-B show perspective views of a front portion of the fan assembly of FIG. 5.
Figure 6B:
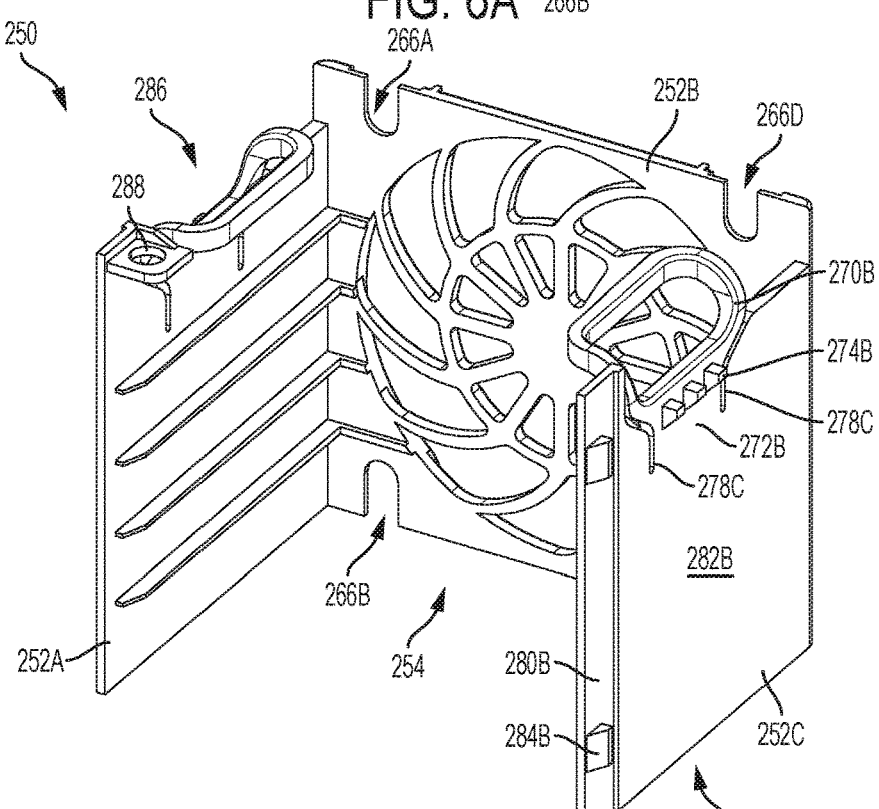
Figure 7A:
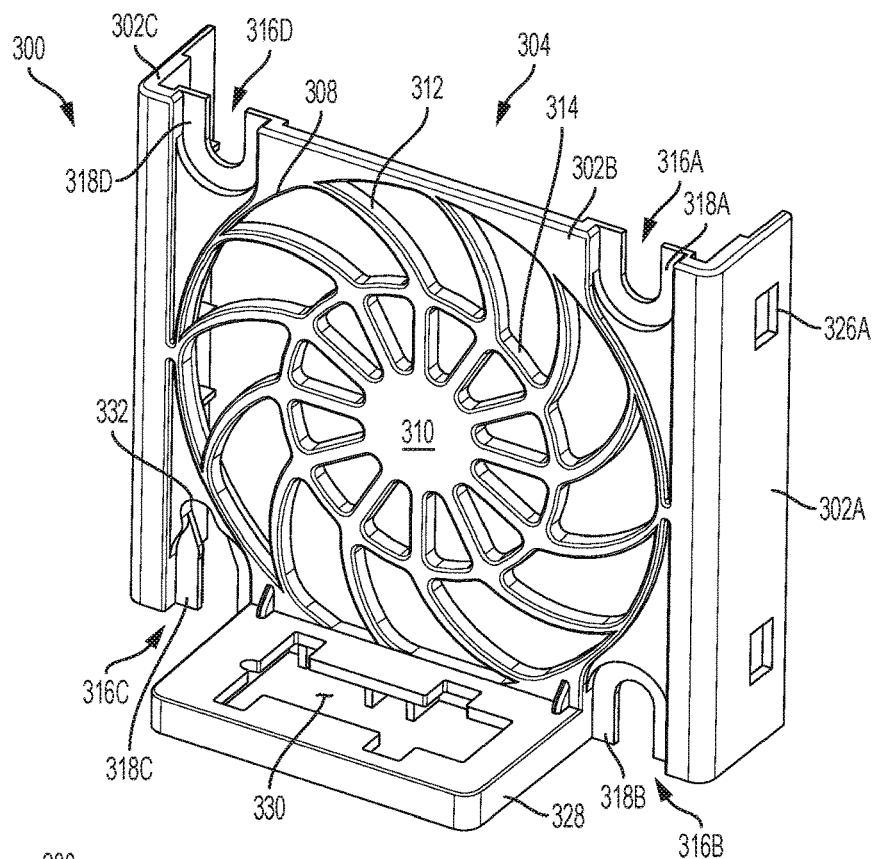
FIGS. 7A-B show perspective views of a back portion of the fan assembly of FIG. 5.
Figure 7B:
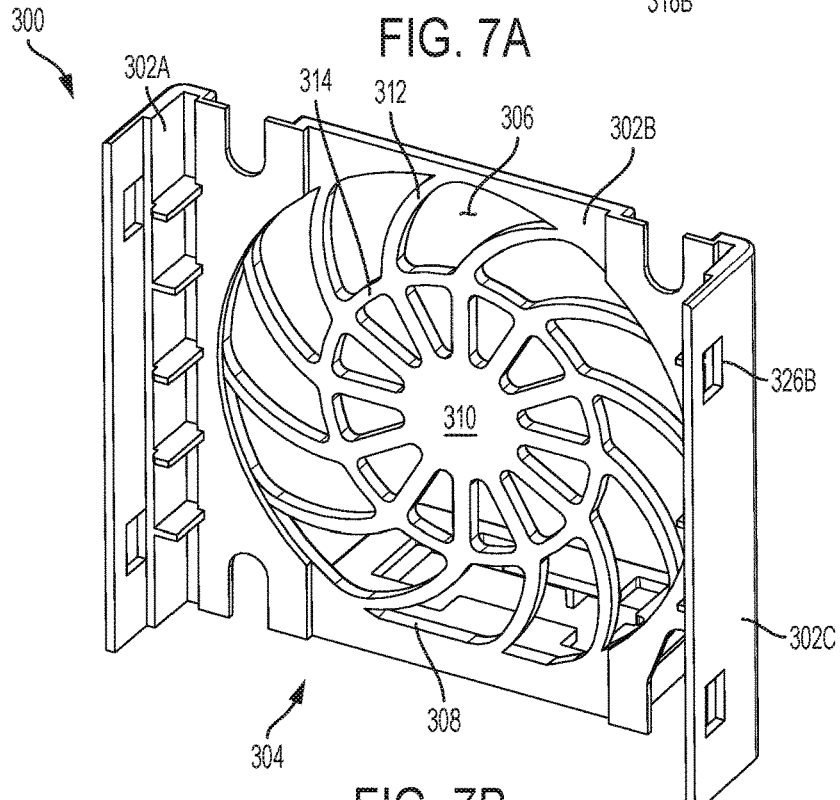
Figure 8A:
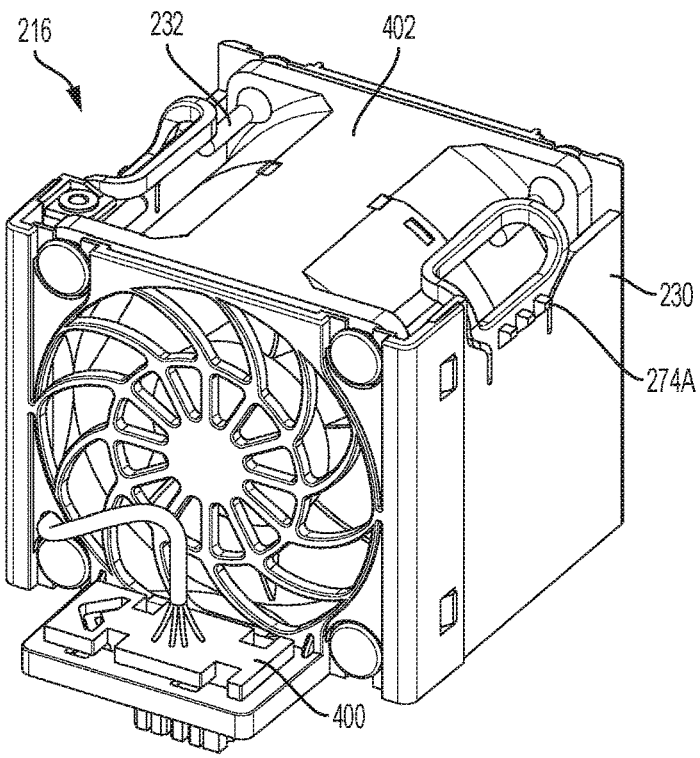
FIGS. 8A-B show perspective views of the fan assembly of FIG. 5.
Figure 8B:
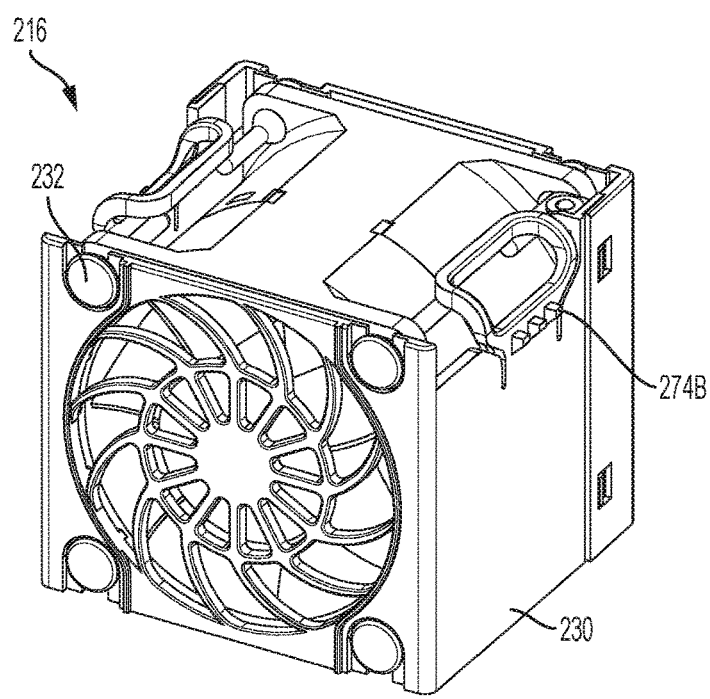

In certain embodiments, the housing 230 is a multi-piece component that includes a front portion 250 (e.g., first housing member) and a back portion 300 (e.g., second housing member) that couple together and at least partially surround the fan module 234. For example, as can be seen in FIGS. 8A-8B, the housing 230 surrounds (e.g., covers, wrapped around) at least four sides of the fan module, with two of the sides of the fan module uncovered by the housing 230. The front portion 250 is also shown in FIGS. 6A-B, and the back portion 300 is also shown in FIGS. 7A-7B. In certain embodiments, the front portion 250 and the back portion 300 comprise polymers and are made by a molding process such that the features of the housing 230 (e.g., sidewalls, finger guards) are unitarily formed of a single material.

The front portion 250 can be u-shaped (as seen from a top-down perspective) and includes a first sidewall 252A, a second sidewall 252B, and a third sidewall 252C. The second sidewall 252B is positioned between the first sidewall 252A and the third sidewall 252C and includes a finger guard 254. The finger guard 254 includes a plurality of openings 256 that, together, generally form a circle-shaped opening having an outer circumference 258. The finger guard 254 is shown as having a central portion 260 and a plurality of spokes 262 that extend from the central portion 260 to the outer circumference 258. The finger guard 254 also includes a middle circumference portion 264 positioned between the central portion 260 and the outer circumference 258. The finger guard 254 is integral with the front portion 250 of the housing 230 and thus eliminates the need for a separate finger guard. The finger guard 254 also allows for air to flow either to or from the fan module 234 so that the fan module 234 can cool the drawer 200. Further, the finger guard 254 helps prevent operators from contacting the fan module 234 itself, thus preventing potential injury.

In certain embodiments, the second sidewall 252B also includes a plurality of cutout portions 266A-266D, which are shaped to receive the plurality of dampers 232. Although the cutout portions 266A-266D are shown as being u-shaped in FIGS. 6A-6B, the cutout portions 266A-266D can be circle shaped, v-shaped, etc. The second sidewall 252B can include recessed portions 268A-268D to accommodate for or provide additional space for the heads 238 of the plurality of dampers 232.

The first sidewall 252A includes a first pull tab portion 270A. The first pull tab portion 270A includes a first flexible portion 272A, one or more couplers 274A (e.g., protrusions, tabs) and a first handle portion 276A. The first flexible portion 272A is formed between two slots 278A and 278B such that, when an operator pulls against the first handle portion 276A, the first pull tab portion 270A can bend or flex in the direction the operators is pulling while other portions of the sidewall remain relatively rigid to continue supporting the fan module 234. The one or more couplers 274A are shaped to at least partially extend into a respective opening of the sidewalls of the fan cages (see, e.g., FIG. 4B showing the third opening 218C in the third sidewall 216C or the fourth opening 218D in the second sidewall 216B). As such, when the first handle portion 276A is pulled, the one or more couplers 274A can be removed from a respective opening in the sidewalls. As shown in FIGS. 6A-6B, the first handle portion 276A is curved such that the first handle portion 276A provides an opening large enough to grasp but such that the first handle portion 276A does not extend higher than the fan module 234 within the fan assembly 214. In certain embodiments, the housing 230 and the fan module 234 are substantially the same height. Although the one or more couplers 274A are triangular shaped in FIGS. 6A-6B, in other embodiments, the one or more couplers 274A are rectangular shaped, semi-circle shaped, or may have other profiles.

The first sidewall 252A includes one or more couplers 284A (e.g., protrusions, tabs, or the like) that extend from the first recessed surface 280A. The one or more couplers 284A are shaped to at least partially extend into and engage with openings from the back portion 300 of the housing 230 to couple the front portion 250 to the back portion 300. Although the one or more couplers 284A are triangular shaped in FIGS. 6A-6B, in other embodiments, the one or more couplers 284A are rectangular shaped, semi-circle shaped, or may have other profiles.

The first sidewall 252A also includes a first recessed portion 279A with a first recessed surface 280A that is offset a distance from a first main surface 282A of the first sidewall 252A. The distance the first recessed surface 280A is offset from the first main surface 282A can substantially match the thickness of the part of the back portion 300 that couples with the first sidewall 252A using the couplers 284A. In addition, the width of that first recessed surface 280A can substantially match the width of that part of the back portion 300. As a result, when the front portion 250 is coupled to the back portion 300, that part of the back portion 300 rests on the first recessed surface 280A and the first main surface 282A is flush with a main surface of the back portion 300.

The first sidewall 252A also includes an LED section 286 with a mounting hole 288. The LED section 286 extends perpendicularly from first recessed portion 279A and includes a surface on which an LED can rest. Electrical wires to power an LED can be routed through the mounting hole 288. The LED section 286 helps manage electrical wires to minimize the electrical wires blocking or inhibiting air flow to and from the fan module 234.

The third sidewall 252C includes features similar to those of the first sidewall 252A. The third sidewall 252C includes a second pull tab portion 270B, which includes a second flexible portion 272B, one or more couplers 274B (e.g., protrusions, tabs) and a second handle portion 276B. The second flexible portion 272B is formed between two slots 278C and 278D such that, when an operator pulls against the second handle portion 276B, the second pull tab portion 270B can bend or flex in the direction the operators is pulling while other portions of the sidewall remain relatively rigid to continue supporting the fan module 234. The one or more couplers 274B are shaped to at least partially extend into a respective opening of the sidewalls of the fan cages (see, e.g., FIG. 4B showing the third opening 218C in the third sidewall 216C or the fourth opening 218D in the second sidewall 216B). As such, when the second handle portion 276B is pulled, the one or more couplers 274B can be removed from a respective opening in the sidewalls. As shown in FIGS. 6A-6B, the second handle portion 276B is curved such that the second handle portion 276B provides an opening large enough to grasp but such that the second handle portion 276B does not extend higher than the fan module 234 within the fan assembly 214. Although the one or more couplers 274B are triangular shaped in FIGS. 6A-6B, in other embodiments, the one or more couplers 274B are rectangular shaped, semi-circle shaped, or may have other profiles.

The one or more couplers 284B are shaped to at least partially extend into and engage with openings from the back portion 300 of the housing 230 to couple the front portion 250 to the back portion 300. Although the one or more couplers 284B are triangular shaped in FIGS. 6A-6B, in other embodiments, the one or more couplers 284B are rectangular shaped, semi-circle shaped, or may have other profiles.

The third sidewall 252C also includes a second recessed portion 279B with a second recessed surface 280B that is offset a distance from a second main surface 282B of the second sidewall 252B. The distance the second recessed surface 280B is offset from the second main surface 282B can substantially match the thickness of the part of the back portion 300 that couples with the third sidewall 252C using the couplers 284B. In addition, the width of that second recessed surface 280B can substantially match the width of that part of the back portion 300. As a result, when the front portion 250 is coupled to the back portion 300, part of the back portion 300 rests on the second recessed surface 280B and the second main surface 282B is flush with a main surface of the back portion 300. The third sidewall 252C includes one or more couplers 284B (e.g., protrusions, tabs) that extend from the second recessed surface 280B.

FIGS. 7A-7B show the back portion 300 of the housing 230 of the fan assembly 214. The back portion 300 can be u-shaped (from a top-down perspective) and include a first sidewall 302A, a second sidewall 302B, and a third sidewall 302C.

The second sidewall 302B is positioned between the first sidewall 302A and the third sidewall 302C and includes a finger guard 304. The finger guard 304 includes a plurality of openings 306 that, together, generally form a circle-shaped opening having an outer circumference 308. The finger guard 304 is shown as having a central portion 310 and a plurality of spokes 312 that extend from the central portion 310 to the outer circumference 308. The finger guard 304 also includes a middle circumference portion 314 positioned between the central portion 310 and the outer circumference 308. In certain embodiments, the second sidewall 302B also includes a plurality of cutout portions 316A-316D, which are shaped to receive the plurality of dampers 232. Although the cutout portions 316A-316D are shown as being u-shaped in FIGS. 7A-7B, the cutout portions 316A-316D can be circle shaped, v-shaped, etc. The second sidewall 302B can include recessed portions 318A-318D to accommodate for or provide additional space for the heads 238 of the plurality of dampers 232. One of the recessed portions (i.e., 318C) includes an additional recessed portion 332, which is shaped such that an electrical wire or cable can extend through the additional recessed portion 332 from the fan module 234 to an electrical connector (see FIG. 8A).

The first sidewall 302A includes a first recessed portion 320A with a first recessed surface 322A that is offset a distance from a first main surface 324A of the first sidewall 302A. The distance the first recessed surface 322A is offset from the first main surface 324A can be set such that, when the front portion 250 is coupled to the back portion 300, the first recessed surface 324A of the back portion 300 rests on the second recessed surface 280B and the first main surface 324A of the back portion 300 is flush with the second main surface 282B of the front portion 250. The first sidewall 302A includes one or more openings 326A that are shaped to receive the one or more couplers 284B such that the one or more couplers 284B at least partially extend into and engage with the openings 326A to couple the front portion 250 to the back portion 300.

The third sidewall 302C includes a second recessed portion 320B with a second recessed surface 322B that is offset a distance from a second main surface 324B of the third sidewall 302C. The distance the second recessed surface 322B is offset from the second main surface 324B can be set such that, when the front portion 250 is coupled to the back portion 300, the second recessed surface 322B of the back portion 300 rests on the first recessed surface 280A and the second main surface 324B of the back portion 300 is flush with the first main surface 282A of the front portion 250. The third sidewall 302C includes one or more openings 326B that are shaped to receive the one or more couplers 284A such that the one or more couplers 284A at least partially extend into and engage with the openings 326B to couple the front portion 250 to the back portion 300.

The back portion 300 of the housing 230 also includes an electrical connector portion 328 that extends from the second sidewall 302B. The electrical connector portion 328 includes an opening 330 through which an electrical connector (see electrical connector 400 for the fan module 234 in FIG. 8A) can extend through. For example, the electrical connector 400 can couple to one of the electrical connectors 210A-210D of the printed circuit board assembly 208 to power the fan module 234. The opening 330 of the electrical connector portion 328 can be shaped such that the electrical connector 400 can move between a non-secured position and a secured position. The electrical connector 400 can be snapped into and out of the secured position. Securing the position of the electrical connector 400 helps reduce vibration.

FIGS. 8A-8B show the fan assembly 216 in a fully-assembled state—ready to be coupled to one of the four fan cages 212A-212D in the fan cage assembly 206. As shown, each of the eight dampers 232 extend through one of the cutout portions (i.e., cutout portions 266A-266D and cutout portions 316A-316D) of the housing 230 and also one of the mounting holes 236 of the fan module 234 to couple the housing 230 to the fan module 234. Further, the housing 230 partially surrounds the fan module 234 such that a top surface 402 and a bottom surface (not shown) of the fan module 234 is exposed and not covered or surrounded by the housing 230. Put another way, the housing 230 covers four of the six sides of the fan module 234 (e.g., is wrapped around four of the six sides of the fan module 234).

The front portion 250 and the back portion 300 of the housing 230 are coupled together such that the one or more couplers (i.e., couplers 284A-284B) of the front portion 250 at least partially extend into the one or more openings (i.e., openings 326A-326B) of the back portion 300. For example, the one or more couplers can snap into the openings to maintain coupling between the front portion 250 and the back portion 300. Although the figures show the couplers being part of the front portion 250 and the openings being part of the back portion 300, a reverse arrangement of the couplers and openings can be implemented.

In use, once the fan assembly 216 is in its fully-assembled state, the fan assembly 216 can be removably coupled to one of the four fan cages 212A-212D in the fan cage assembly 206. To install the fan assembly 216 to the fan cage 212, the fan assembly 216 can be inserted into the fan cage 212 such that the couplers (i.e., 274A-274B) extend into respective openings (i.e., 218C-218D) of the fan cage 212. For example, the one or more couplers can snap into the openings to couple the fan assembly 216 to the fan cage 212. FIG. 4B shows one or more couplers positioned within one of the openings of the fan cage 212A. Further, the electrical connector 400 can be electrically coupled to one of the electrical connectors 210A-210D of the printed circuit board assembly 208.

To remove the fan assembly 216 from the fan cage 212, an operator can pull the first pull tab portion 270A and the second pull tab portion 270B toward each other. When the pull tab portions are pulled toward each other, the flex portions (i.e., 272A-272B) flex and the couplers (i.e., 274A-274B) disengage from the openings (i.e., 218C-218D) to allow the fan assembly 216 to be removed from the fan cage 212. As such, the fan assembly 216 can be removed from the fan cage 212 with one hand (and two fingers) by simply pinching the first pull tab portion 270A and the second pull tab portion 270B of the housing 230 and pulling the fan assembly 216 out of the fan cage 212.

The above-described installation and removal of the fan assembly 216 with the fan cage 212 does not require use of tools such as screwdrivers, etc., and does not require many parts. Further, the fan assembly 216 has a lower profile (e.g., is less tall) than current fan assembly designs. This low-profile design helps provide additional space and flexibility within the drawer 200 for routing electrical cables and the like. Further, incorporation of the dampers 232 helps reduce the amount vibration transmitted to other parts of the drawer 200 and the data storage system 100. Further yet, incorporation of the fingers guards (i.e., 254 and 304) into the housing 230 reduces the number of separate parts and therefore reduces complexity and the time required to assemble the fan assembly 216.

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

We claim:

1. A data storage system comprising:
a drawer;
a plurality of fan assemblies positioned within the drawer, each fan assembly comprising:
a fan module having a plurality of mounting openings,
a housing partially surrounding the fan module, and
a plurality of dampers that extend through the plurality of mounting openings to couple the fan module to the housing;
a fan cage assembly positioned within the drawer and including fan cages, each of the plurality of fan assemblies removably coupled to a respective fan cage; and
a circuit board positioned within the drawer, each of the fan cages including a plurality of legs extending from a bottom sidewall of the fan cages towards the circuit board to create a space between the bottom sidewall of the fan cage and the circuit board to permit electrical components to pass underneath the fan cage assembly.

2. The data storage system of claim 1, wherein each of the fan cages includes a first opening and a second opening, and wherein the housing of the respective fan assemblies includes a first coupler and a second coupler positioned on opposite sides of the housing, and wherein the fan assemblies are removably coupled to the respective fan cages via engaging and disengaging the first coupler with the first opening and engaging and disengaging the second coupler with the second opening.

3. The data storage system of claim 2, wherein the first couplers are positioned on respective first flexible portions, and wherein the second couplers are positioned on respective second flexible portions.

4. The data storage system of claim 1, wherein the housings include a first handle coupled to a first flexible portion and a second handle coupled to a second flexible portion.

5. The data storage system of claim 1, wherein the fan cage assembly includes.

6. The data storage system of claim 1, wherein the housings include an electrical connector portion with an opening.

7. The data storage system of claim 1, wherein the housings surround only four sides of the respective fan modules.

8. The data storage system of claim 1, wherein the housings include a first finger guard and a second finger guard opposite the first finger guard.

9. An apparatus comprising:
   a fan module having a plurality of mounting openings and electrically coupled to an electrical connector;
   a housing partially surrounding the fan module, the housing including:
      a first housing member having a first finger guard,
      a second housing member coupled to the first housing member and having a second finger guard and an electrical connector portion, the electrical connector portion extending from the second housing member and including an opening shaped such that the electrical connector can be moved between a secured and a non-secured position within the opening, and
      a plurality of openings, one of which includes a recessed portion;
   a plurality of dampers that extend through the plurality of mounting openings to couple the fan module to the housing and that extend through respective openings of the plurality of the openings of the housing; and
   an electrical wire electrically coupled between the electrical connector and the fan module and extending through the recessed portion.

10. The apparatus of claim 9, wherein the dampers comprise an elastomer.

11. The apparatus of claim 9, wherein the housing surrounds only four sides of the fan module.

12. The apparatus of claim 9, wherein the first housing member includes a first flex portion coupled to a first handle and a second flex portion coupled to a second handle.

13. The apparatus of claim 9, wherein the second housing member includes a first opening and a second opening, wherein the first housing includes a first coupler and a second coupler, wherein the first coupler at least partially extends in the first opening, and wherein the second coupler at least partially extend in the second opening.

* * * * *